(12) United States Patent
Goldie et al.

(10) Patent No.: US 7,145,337 B2
(45) Date of Patent: Dec. 5, 2006

(54) COIL ARRANGEMENTS

(75) Inventors: Frederick Thomas Goldie, Worthing (GB); Michael Colin Begg, Worthing (GB)

(73) Assignee: Tesla Engineering Limited, Sussex (GB)

( * ) Notice: Subject to any disclaimer, the term of this patent is extended or adjusted under 35 U.S.C. 154(b) by 0 days.

(21) Appl. No.: 10/512,566

(22) PCT Filed: Jun. 9, 2003

(86) PCT No.: PCT/GB03/02448

§ 371 (c)(1),
(2), (4) Date: Oct. 25, 2004

(87) PCT Pub. No.: WO03/104831

PCT Pub. Date: Dec. 18, 2003

(65) Prior Publication Data
US 2005/0179434 A1    Aug. 18, 2005

(30) Foreign Application Priority Data
Jun. 7, 2002    (GB) ................................ 0213131.6

(51) Int. Cl.
*G01V 3/00* (2006.01)
(52) U.S. Cl. ...................... 324/318; 324/322
(58) Field of Classification Search ................. 324/318, 324/319, 322, 309, 307, 300; 600/410, 420, 600/422
See application file for complete search history.

(56) References Cited

U.S. PATENT DOCUMENTS

| | | | |
|---|---|---|---|
| 4,794,338 A * | 12/1988 | Roemer et al. .............. 324/319 |
| 5,235,281 A * | 8/1993 | Haragashira et al. ........ 324/318 |
| 5,289,129 A * | 2/1994 | Joseph ........................ 324/318 |
| 5,296,810 A * | 3/1994 | Morich ........................ 324/318 |
| 5,311,135 A * | 5/1994 | Vavrek et al. ............... 324/318 |
| 5,406,205 A | 4/1995 | Müller |
| 5,736,858 A * | 4/1998 | Katznelson et al. ......... 324/318 |
| 6,144,204 A | 11/2000 | Sementchenko |
| 6,311,389 B1 | 11/2001 | Uosaki et al. |

FOREIGN PATENT DOCUMENTS

EP    0 317 775 A2    5/1989

* cited by examiner

Primary Examiner—Brij B. Shrivastav
(74) Attorney, Agent, or Firm—Nixon & Vanderhye P.C.

(57) ABSTRACT

Apparatus (10) for use in MRIS includes a coil arrangement having drive coils (20), shield coils (30) and a power supply unit (PSU) (40). The drive coils (20) and the shield coils (30) are connected in series to the PSU (40) to form a circuit. The shield coils (30) are connected between a first and second length of the drive coils (20) so as to straddle a virtual earth of the circuit. This is advantageous in minimising potential differences within the shield coil (30) assembly and thereby in minimising partial discharge therewithin. Partial discharge between adjacent parts of the drive coils (20) is minimised by spatially arranging those coils (20) such that parts thereof that are at a high electrical potential are spatially adjacent parts thereof that are simultaneously at a potential of the same polarity of at a low electrical potential of either polarity.

16 Claims, 4 Drawing Sheets

COIL ARRANGEMENTS

This application is the US national phase of international application PCT/GB03/02448 filed 9 Jun. 2003 which designated the U.S. and claims benefit of UK 0213131.6, dated Jun. 7, 2002, the entire content of which is hereby incorporated by reference.

BACKGROUND

1. Technical Field

This invention relates to coil arrangements and in particular to coil arrangements for use in Magnetic Resonance Imaging and Spectroscopy (MRIS).

2. Related Art

MRIS systems generally comprise a plurality of coils which are located around a region within which a patient or some such other subject can be positioned. The coils include an outermost DC coil arrangement, an inner RF coil arrangement positioned concentrically therewithin and an intermediate gradient coil assembly. The DC coil arrangement is used to provide a strong constant magnetic field. The gradient coil assembly is arranged to generate a time-varying magnetic field which causes the response frequency of the nuclei of the subject to depend upon their positions within the field.

Gradient coil assemblies usually consist of, in a minimum configuration, three primary field-generating coils, referred to herein as the X, Y and Z drive coils. They can be formed by winding a pattern of conductors on the surface of cylinder. Commonly, each of the coils is shielded by another pattern of conductors, termed "shield coils", wound on another cylinder which surrounds the drive coils. The drive coils are shielded to avoid inducing eddy currents in surrounding metallic structure and consequential time-varying magnetic fields in the subject.

Conventional X and Y drive coils each typically comprise four coils, arranged into two pairs, one pair being radially opposite the other and the coils in each pair being axially juxtaposed and aligned with respect to the cylinder. Each coil extends angularly around the surface of the cylinder slightly less than 180°. The appearance of the coils is such that they are termed "saddle windings". The four coils that make up the X drive coils are connected in series and the four coils that make up the Y drive coils are connected in series. A conventional arrangement whereby the coils are connected in series is shown in FIG. 1. The arrangement shown in FIG. 1 is shown unwrapped from a cylindrical surface. For each of the X and the Y drive coils, the coils of each opposite pair are connected together at the centres thereof, and the outside of one coil of one pair is connected to the outside of one coil of the other pair. The outside of the other coil of the one pair and the outside of the other coil of the other pair are each connected to a respective terminal of a power supply unit (not shown). X and Y drive coils are substantially similar to one another in design, with X drive coils being positioned radially inside or outside Y drive coils and angularly displaced by 90 degrees from the Y drive coils, with respect to the cylinder.

Drive coils are typically impregnated with epoxy resin to provide electrical insulation and mechanical strength. However, if a potential difference above a certain threshold exists between spatially adjacent resin-impregnated drive coils, local charge redistribution can occur within microscopic voids and inhomogeneities in the resin. This phenomenon is termed "partial discharge" and can create broad-band electrical interference that is deleterious to the sensitive radio frequency detection systems used in MRIS.

BRIEF SUMMARY

It is an object of this invention to address this problem.

According to an aspect of this invention there is provided a coil arrangement for use in Magnetic Resonance Imaging and Spectroscopy apparatus, the coil arrangement including drive coils and shield coils for at least partially electromagnetically shielding the drive coils, wherein the drive coils and the shield coils are connected in series, the shield coils being between a first length of the drive coils and a second length of the drive coils.

Preferably, the shield coils are connected between the first and second lengths so as to be electrically adjacent a virtual earth of the circuit that is formed when the coil arrangement is connected, in use, to a symmetrical alternating power supply unit. Most preferably, the arrangement is such that the shield coils straddle the virtual earth.

Positioning the shield coils so as to be electrically adjacent a virtual earth of the circuit is advantageous in minimizing the potential differences within the shield coil assembly, thereby minimizing the likelihood of partial discharge in the shield coils. Furthermore, mutual inductance between the drive coils and the shield coils acts to at least partially cancel self inductance of the shield coils.

The drive coils may be comprised of at least one group of drive coils including at least two respective drive coils connected together in series, wherein the coils are spatially arranged such that, in use, the potential differences between adjacent parts thereof are minimised, thereby minimising partial discharge therebetween.

According to another aspect of this invention there is provided a drive coil arrangement for use in Magnetic Resonance Imaging and Spectroscopy apparatus, the drive coil arrangement including at least one group of drive coils including at least two respective drive coils connected together in series, wherein the coils are spatially arranged such that, in use, the potential differences between adjacent parts thereof are minimised, thereby minimising partial discharge therebetween.

Preferably, the drive coils are arranged such that, in use, parts thereof that are at a highest electrical potential of one polarity are spatially remote from parts of the drive coils that are simultaneously at a highest electrical potential of the opposite polarity.

The drive coils may be arranged such that, in use, the parts thereof that are the highest electrical potential are spatially adjacent parts of the drive coils that are simultaneously at a potential of the same polarity, or adjacent parts of the drive coils that are at a low electrical potential of either polarity.

There may be two, or preferably three, groups of drive coils, each group including at least two respective drive coils that are connected together in series. Preferably, each group includes four respective series-connected drive coils. Each group may include shield coils connected between the drive coils thereof.

The parts of the drive coils that are at a highest electrical potential of one polarity may be axially spaced and/or radially spaced from the parts that are simultaneously at the highest electrical potential of the opposite polarity, with respect to a cylinder on which the drive coils are positioned.

The drive coils may be arranged such that: a first group of the coils are arranged to make-up an innermost layer of the drive coils, high potential coils thereof being adjacent one end of the cylinder and low potential coils thereof being adjacent the other end of the cylinder; a second group of coils arranged to make-up a layer radially outside and juxtaposed with the radially innermost layer, high potential coils thereof being adjacent the other end of the cylinder and low potential coils thereof being adjacent the one end of the cylinder. A third group of the drive coils may be arranged to make-up a radially outermost layer juxtaposed with the second group, high potential coils of the third group being adjacent the one end of the cylinder and low potential coils of the third group being adjacent the other end of the cylinder.

The drive coils may be arranged such that highest potential coils of a first group of the coils and highest potential coils of a second group of the coils make up a radially innermost layer on the surface of the cylinder; and arranged such that lowest potential coils of the first and the second groups of drive coils make up a second layer, radially outside and juxtaposed with the innermost layer, thereby allowing coils of a third group of drive coils to be laid radially outside the second layer, such that high potential lengths of the coils of the third group are radially spaced from the high potential coils of the first and second groups that make up the radially innermost layer by the radially intermediate second layer of low potential coils.

Preferably the first and second group of drive coils correspond to X and Y drive coils, and the third group of drive coils correspond to Z drive coils.

At least some of the drive coils may be substantially spirally wound and those drive coils thereof that are for connecting electrically adjacent to a power supply or to shield coils during use are preferably arranged for connection to the supply at a centre-most end thereof, i.e. the "eye" of the respective spirally wound coil.

Electrically adjacent and spirally wound coils of the same group are preferably connected together at the outermost end of each coil.

The drive coils may be for positioning on or around one or more planar surfaces, rather than the curved surface of a cylinder. It will be appreciated that foregoing references to a radius of the cylinder would correspond to directions normal to the planar surfaces, and that references to an axis of the cylinder would correspond to lengths of the planar surfaces.

BRIEF DESCRIPTION OF THE DRAWINGS

Specific embodiments of this invention are now described by way of example only with reference to the accompanying drawings, in which.

DETAILED DESCRIPTION OF EXEMPLARY EMBODIMENTS

Figure 1:
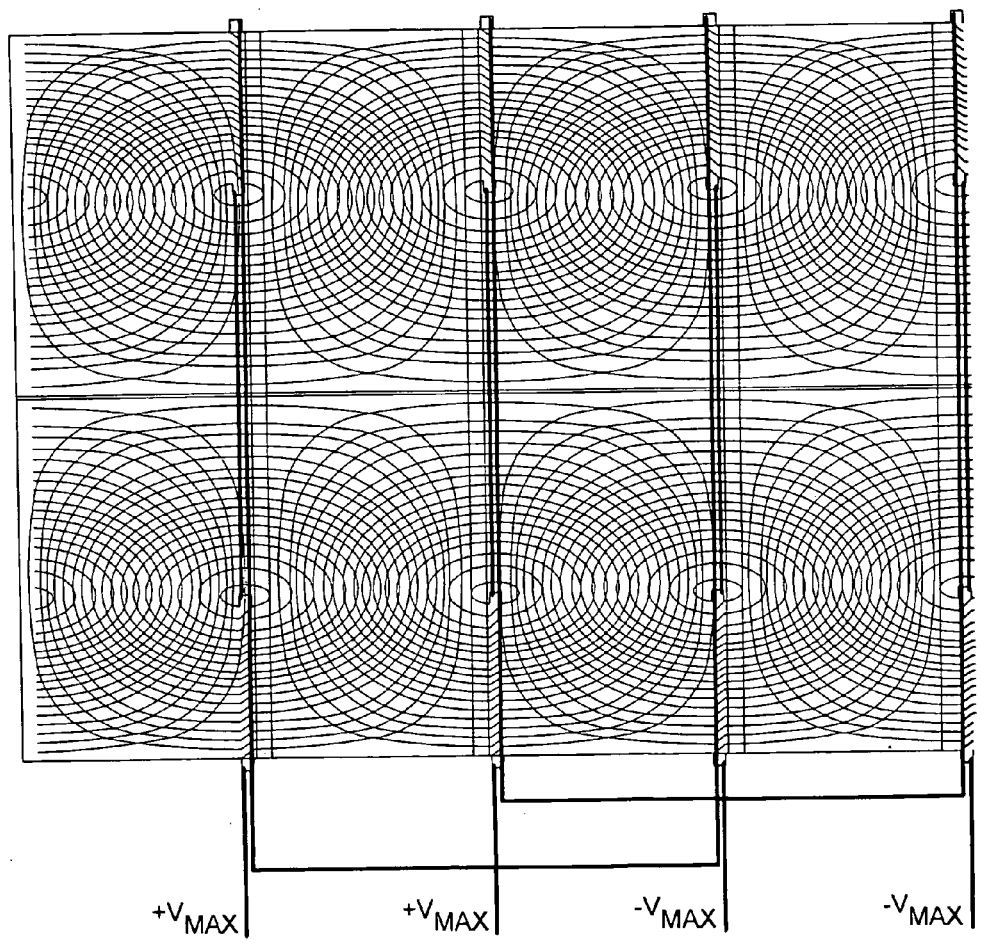
FIG. 1 is a schematic, two-dimensional view of conventional X and Y drive coils.
Figure 2:
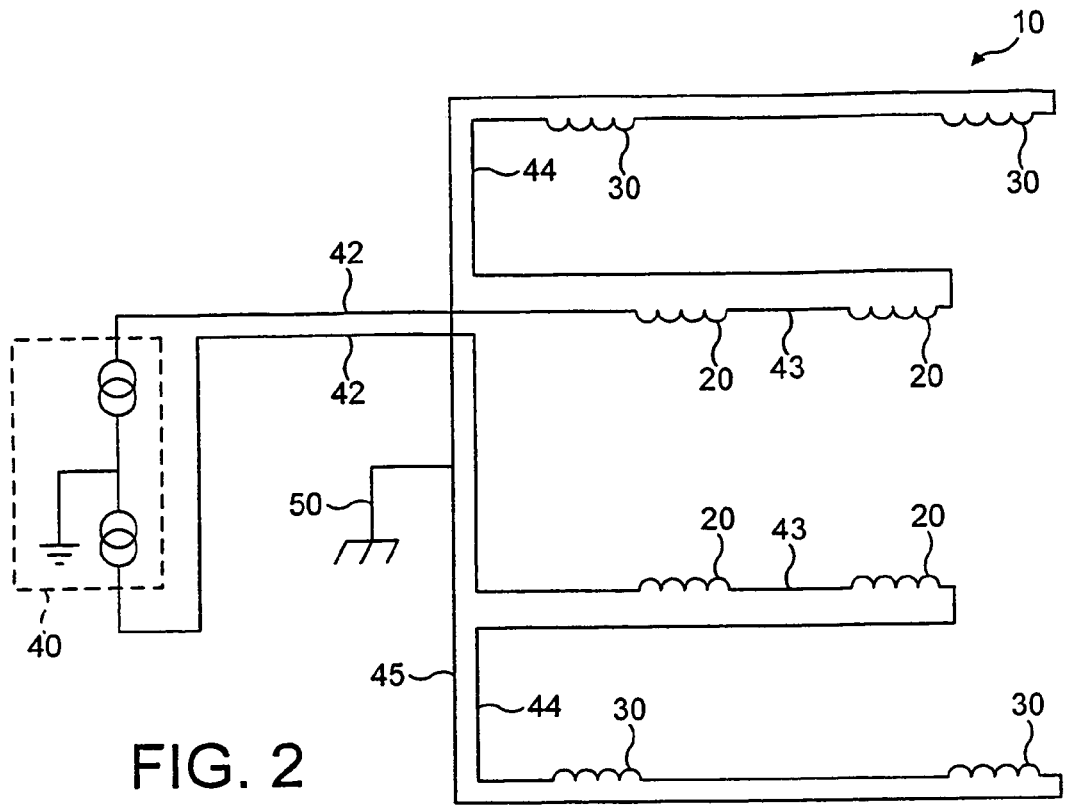
FIG. 2 is a schematic view of Y drive coils and shield coils connected to one another and to a power supply unit.

FIG. 2 shows, in schematic form, apparatus 10 for use in MRIS. The apparatus 10 includes drive coils 20, shield coils 30 and a power supply unit (PSU) 40. The drive coils are Y drive coils. It should be noted, however, that for the purposes of the description with reference to FIG. 2, the drive coils 20 may be X, Y or Z drive coils, the principle described with reference to FIG. 1 being of general application to all drive coils. The shield coils 30 shown in FIG. 2 are those that seek to shield the drive coils 20 of FIG. 2.

Some features of the drive coils 20 and the shield coils 30 are conventional. The drive coils 20 are comprised of four, spirally-wound coils 20 positioned on the outside surface of a cylinder (not shown). The drive coils 20 are arranged in two pairs, for example a top pair and a bottom pair, each pair being diametrically opposite the other pair. The shield coils 30 are arranged outside and around the drive coils 20 and are also comprised of four, spirally-wound coils arranged in two diametrically opposite pairs.

The drive coils 20 differ from conventional coils in the way in which they are electrically connected. The drive coils 20 are connected to the PSU 40 by first electrical connectors 42. A respective one of the electrical connectors 42 is connected between a first coil 20 of each opposite pair and a respective one of the terminals of the PSU 40. The two coils 20 that make up each opposite pair are connected together by a respective one of second electrical connectors 43. The second coil 20 of each opposite pair is connected to one end of a respective one of third electrical connectors 44. The other end of each of the third electrical connectors 44 is connected to a first shield coil 30 of a respective one of the opposite pairs of the shield coils 30. The shield coils are connected together by a fourth electrical connector 45.

In summary, the arrangement is a symmetrical arrangement with all the drive coils 20 and the shield coils 30 connected in series. The four shield coils 30 are in the centre of the series, sandwiched between the two pairs of the drive coils 20, which in turn are sandwiched between the two terminals of the PSU 40.

The PSU 40 is a symmetrical power supply unit. Such PSUs, rather than having one live terminal and one neutral terminal, have two live terminals, each arranged to supply an alternating current that is 180 degrees out of phase with that supplied by the other terminal. In connecting a symmetrical PSU across electrical components, a virtual earth is created at an electrical midpoint of the circuit formed thereby.

In use of the apparatus 10, the PSU 40 is operated to connect a time varying potential difference across the drive coils 20 and the shield coils 30 and so as to create a virtual earth 50 at an electrical midpoint of the circuit created thereby. As the shield coils 30 are connected between the drive coils 20, the virtual earth 50 lies substantially midway along the length of the combined series of shield coils 30. Thus, the potential difference across the shield coils 30, when considered together, is minimized. This in turn minimizes the likelihood of partial discharge between parts of the shield coils 40 and the aforementioned deleterious effects thereof.

It is appreciated that, in practice, the virtual earth 50 may vary slightly in position and may not coincide with the shield coils 40 as described above. Although such variation in the position of the virtual earth 50 is not preferred, it is unimportant provided that the virtual earth 50 remains at least substantially adjacent the shield coils 30 such that the potential differences thereacross are maintained below a level at which partial discharge tends to occur.

In this embodiment, the symmetrical PSU's 40 characteristic of providing a virtual earth at an electrical midpoint is used to minimize the incidence of partial discharge across parts of the shield coils 30. A further advantage of using the symmetrical PSU 40 is that the maximum potential to which it raises parts of the drive coils 20 and shield coils 30 is half of that which would result from using a conventional, asymmetrical alternating supply to create the same potential difference. Thus, the use of the symmetrical PSU 40 may also tend to reduce the incidence of partial discharge in the drive coils 20, when compared with the use of a conventional, asymmetrical PSU.

Figure 2A:
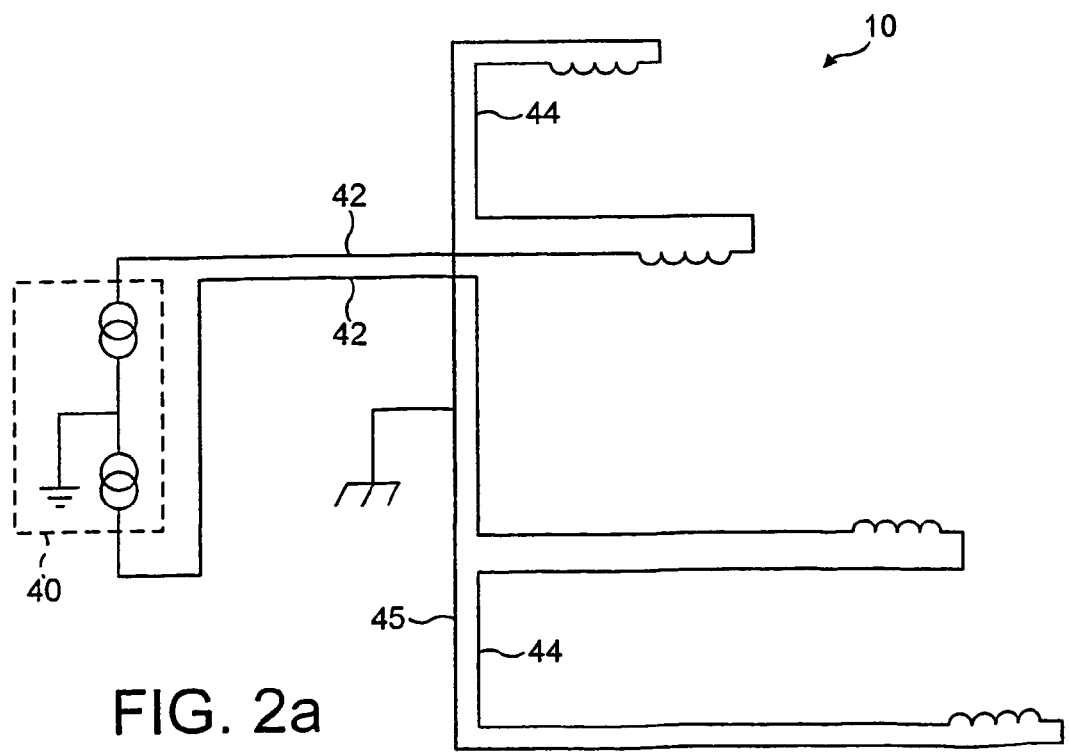
FIG. 2a is a schematic view of Z drive coils and shield coils connected to one another and to a power supply unit.

As stated above, the drive coils 20 of the embodiment described with reference to FIG. 2 are Y drive coils, but they may be X or Z drive coils. Where they are Z drive coils, it will be appreciated that one respective Z drive coil would be substituted for each pair of the juxtaposed Y drive coils. This arrangement is shown in FIG. 2a.

Another aspect of this embodiment is described with reference to FIG. 3 and FIG. 4. It is preferred that this aspect be combined with the aspect described above with reference to FIG. 2, although it is envisaged that this aspect, or that described with reference to FIG. 2, may be used in isolation from the respective other aspect. Where the aspect described below with reference to FIGS. 3 and 4 is used in isolation, any reference to shield coils should be overlooked and a direct electrical link should be considered to be substituted for such coils.

Figure 3:
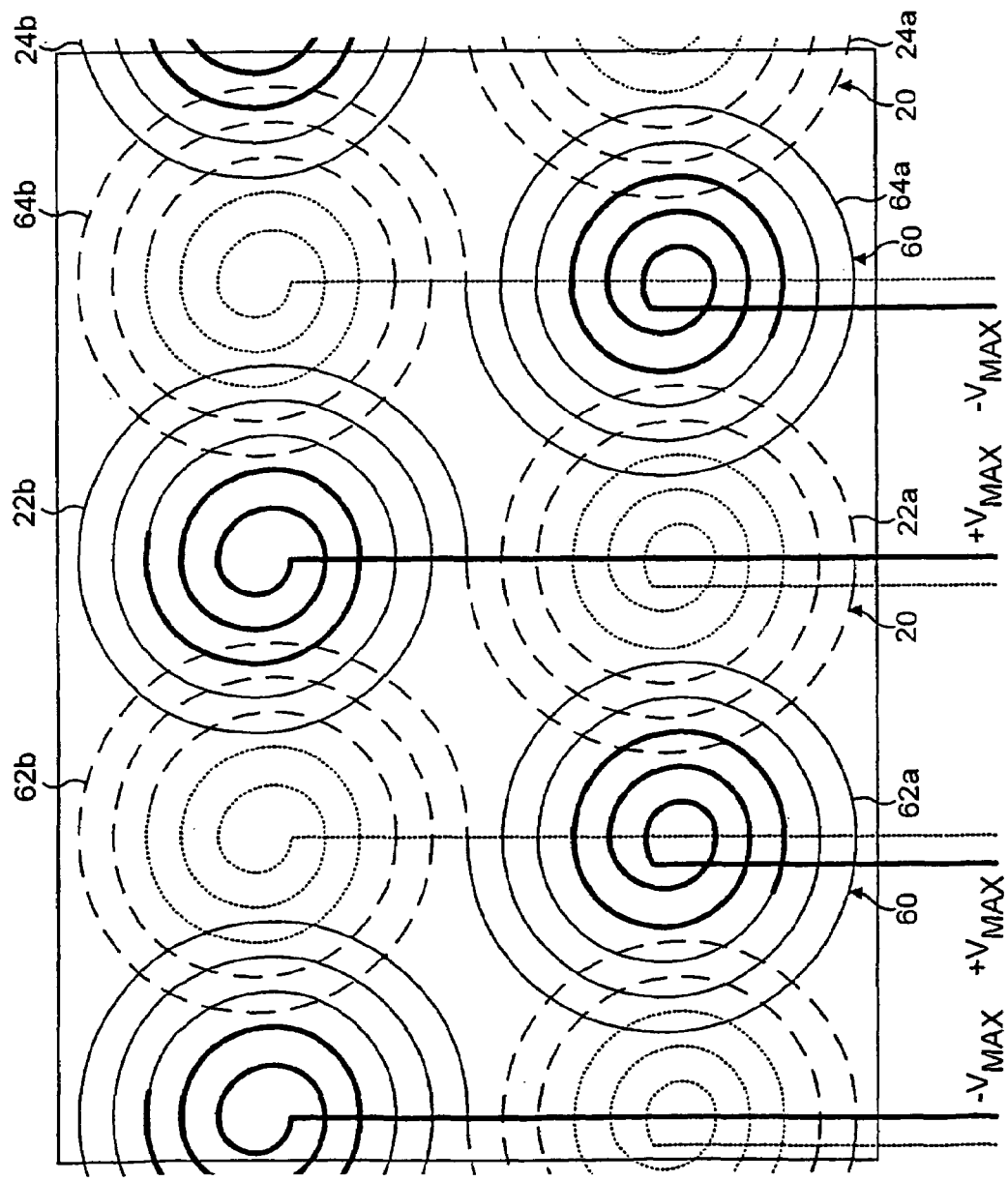
FIG. 3 is a schematic, two-dimensional view of the Y drive coils of FIG. 2, and of X drive coils.
Figure 4:
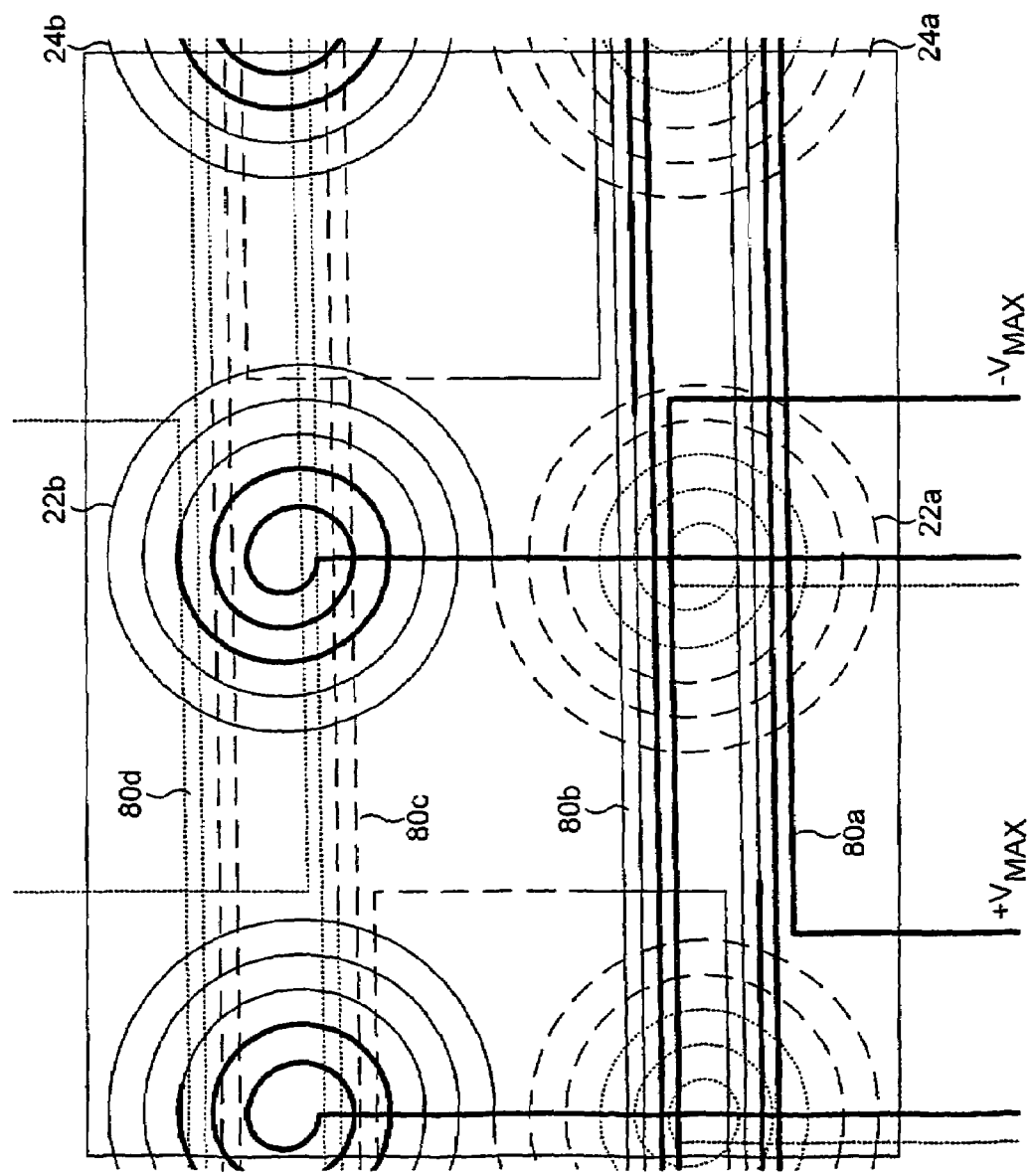
FIG. 4 is a schematic, two-dimensional view of the Y drive coils of FIG. 2 and FIG. 3, and of Z drive coils.

FIG. 3 shows X drive coils 60 and the Y drive coils 20 of FIG. 2 as they would appear were they removed from the surface of the cylinder (not shown) and laid out flat on a two dimensional surface. The arrangement of the X drive coils 60 is similar to that of the Y drive coils 20, being comprised of two diametrically opposite pairs of spirally-wound coils. Each pair of X drive coils 60 is angularly displaced from each adjacent pair of Y drive coils 20 by 90 degrees. Thus, there is a first pair of X drive coils 62, consisting of a first coil 62a at a first end of the cylinder and a second coil 62b at the other end of the cylinder. There is a first pair of Y drive coils 22 angularly displaced from and overlapping the first pair of X drive coils 62 and consisting of a first coil 22a at the first end of the cylinder and a second coil 22b at the other end. There is a second pair of X drive coils 64 angularly displaced from and overlapping the first pair of Y drive coils 22 and consisting of a first coil 64a at the first end of the cylinder and a second coils 64b at the other end. Finally, there is a second pair of Y drive coils 24 angularly displaced from and overlapping the second pair of X drive coils 64 (and the first pair of X drive coils 62) and consisting of a first coil 24a at a first end of the cylinder and a second coil 24b at the other end.

Preferably, the X drive coils 60 are connected to the corresponding shield coils (not shown in FIG. 3) in substantially the same way as the Y drive coils are connected to the shield coils that correspond thereto and as described above with reference to FIG. 2.

The two coils 22a,22b;62a,62b;24a,24b;64a,64b that make up each pair of coils 22,62,22,64 are connected together at their respective outermost ends.

The first coil 62a of the first pair of X drive coils 62 is connected at its centremost point to one terminal of the symmetrical PSU 40 (not shown in FIG. 3). The second coil 62b of that pair 62 is connected at its innermost end to one end of the corresponding shield coils. The other end of those shield coils is connected to the innermost end of the second coil 64b of the second pair of X drive coils 64. The first coil 64a of that pair 64 is connected at its innermost end to the other terminal of the symmetrical PSU 40.

The second coil 22b of the first pair of Y drive coils 22 is connected at its innermost end to one terminal of another symmetrical PSU (not shown) that is substantially the same as the PSU 40. The first coil 22a of that pair 22 is connected at its innermost end to one end of the corresponding shield coils. The other end of those shield coils is connected to the innermost end of the first coil 24a of the second pair of Y drive coils 24. The first coil 24a of that pair 24 is connected to the other terminal of the other PSU.

In use, the areas of highest potential will be the inner areas of those coils 62a, 22b, 64a, 24b that are connected to terminals of the symmetrical PSUs 40. The areas of lowest potential will be the inner areas of those coils 62b,22a,64b, 24a that are connected to the shield coils. In FIG. 3, the style of the line used to depict lengths of conductor that go to make up the drive coils 20, 60 are indicative of the potential of that length. A thick solid line indicates the highest potential, whether positive or negative; a thin solid line indicates merely a high potential; a dashed line indicates a low potential; and a dotted line indicates the lowest potential, i.e. that closest to being neutral.

The spatial arrangement of the coils 22a,22b;62a,62b; 24a,24b;64a,64b described above ensures that the areas of high potential are spatially remote from one another and are adjacent areas of low potential. This is advantageous in minimizing potential differences between nearby conductors so as to minimise the likelihood of partial discharge in those areas of high potential.

FIG. 4 shows the Y drive coils 20 only of FIG. 3, together with Z drive coils 80. The Z drive coils 80 are comprised of four coils, each helically wound in a generally circumferential direction around the outside surface of the cylinder. The Z drive coils are distributed axially along the length of the cylinder. FIG. 4 shows the Y drive coils 20 and the Z drive coils as they would appear were they laid out flat on a two dimensional surface.

The positioning of the Z drive coils 80 is similar to that of conventional MRIS apparatus in that a first one 80a of the Z drive coils is adjacent the aforementioned first end of the cylinder, and second 80b, third 80c and fourth 80d Z drive coils are positioned progressively further from the first end, such that the fourth Z drive coil 80d is adjacent the other end of the cylinder.

The Z drive coils 80 are mounted radially outside the Y drive coils 20, which in turn are mounted radially outside the X drive coils 60. Thus, the Z drive coils 80 are radially spaced from the X drive coils 60 by the intermediately-positioned Y drive coils 20.

The way in which the four Z drive coils 80 are connected to each other and to the PSU differs from that of conventional MRIS apparatus. One end of the first Z drive coil 80a is connected to one terminal of a further symmetrical PSU (not shown in FIG. 4) that is substantially the same as PSU 40 and the other end of the first Z drive coil 80a is connected to a first end of the third Z drive coil 80c.

One end of the second Z drive coil is connected to the other terminal of the further PSU and the other end of the second Z drive coil 80c is connected to a first end of the fourth drive coil 80d.

The other end of each of the third Z drive coil 80c and the fourth Z drive coil 80d are connected to either side of the corresponding shield coils (not shown) such that those shield coils are connected in series between, on one side, the first 80a and third 80c Z drive coils and, on the other side, the fourth 80d and second 80b Z drive coils. The Z drive coils 80 are, in turn, connected in series between the terminals of the PSU 40. It will be appreciated that this is a substantially similar arrangement to that described with reference to FIG. 2. In an alternative embodiment, the other end of each of the third Z drive coil 80c and the fourth Z drive coil 80d are connected together.

In operation, the lengths of the Z drive coils 80 that are at the highest potential are those electrically adjacent the two terminals of the symmetrical PSU 40. As in FIG. 3, the style of the lines used to depict conductors of the Z drive coils 80 is indicative of the potential of those conductors. Thus, the high potential lengths of the Z drive coils 80 are spatially remote from the high potential areas of the Y drive coils 20 and spatially adjacent the low potential areas thereof. As stated above, the X drive coils 60 are radially spaced from the Z drive coils 80 with respect to the cylinder, as a result of the Y drive coils 20 being radially therebetween. Thus, the Z drive coils are separated axially from the high potential area of Y drive coils 20 and separated radially from the high potential areas of the X drive coils 60.

In this embodiment, it will be appreciated that the first Z drive coil 80*a* may be connected to the fourth Z drive coil 80*d*, rather than the third Z drive coil; and that the second Z drive coil 80*b* may be connected to the third Z drive coil 80*c*, rather than the fourth Z drive coil 80*d*, without substantially altering the arrangement.

In this embodiment, an arrangement of X, Y and Z drive coils 60, 20, 80 has been adopted whereby the X drive coils 60 are radially innermost, the Z drive coils 80 are radially outermost, and the Y drive coils 20 are radially intermediate. It is envisaged that this arrangement may be reversed such that substantially the same result achieved.

In an alternative embodiment, not shown in the drawings, it is envisaged that the Z drive coils would not be arranged such that the high potential lengths thereof are adjacent one end of the cylinder. Instead, it is envisaged that any of the X drive coils and Y drive coils that include an area of high potential would be positioned radially innermost, creating a high potential layer adjacent the outside surface of the cylinder. Each of these high potential coils would have a low potential drive coil of the respective other axis radially outside it, creating a low potential layer. The Z drive coils would then be laid around the low potential layer in any convenient manner.

It is also envisaged that the radial arrangement of the drive coils in this alternative embodiment may be reversed, such that the Z drive coils are radially innermost, the high potential X and Y drive coils are radially outermost and the low potential X and Y coils are radially intermediate. It will be appreciated that this reversed arrangement would give substantially the same result as the first-mentioned arrangement of the alternative embodiment.

What is claimed is:

1. A coil arrangement for use in Magnetic Resonance Imaging and Spectroscopy apparatus, the coil arrangement including:
    drive coils and shield coils for at least partially electromagnetically shielding the drive coils,
    wherein the drive coils and the shield coils are connected in series, and
    wherein the drive coils comprise symmetrical first and second lengths of drive coils and the shield coils are connected between the first length of the drive coils and the second length of the drive coils to provide a symmetrical coil arrangement.

2. A coil arrangement according to claim 1, wherein the shield coils are connected between the first and second lengths so as to be electrically adjacent a virtual earth of the circuit that is formed when the coil arrangement is connected, in use, to a symmetrical alternating power supply unit.

3. A coil arrangement according to claim 2, wherein the arrangement is such that the shield coils straddle the virtual earth.

4. A coil arrangement according to claim 1, wherein:
    the drive coils are comprised of at least one group of drive coils including at least two respective drive coils connected together in series, and
    the coils are spatially arranged such that, in use, the potential differences between adjacent parts thereof are minimized, thereby minimizing partial discharge therebetween.

5. A coil arrangement according to claim 4, wherein the drive coils are arranged such that, in use, parts thereof that are at a highest electrical potential of one polarity are spatially remote from parts of the drive coils that are simultaneously at a highest electrical potential of the opposite polarity.

6. A coil arrangement according to claim 4, wherein the drive coils are arranged such that, in use, the parts thereof that are the highest electrical potential are spatially adjacent parts of the drive coils that are simultaneously at a potential of the same polarity, or adjacent parts of the drive coils that are at a low electrical potential of either polarity.

7. A coil arrangement according to claim 4, wherein the parts of the drive coils that are, in use, at a highest electrical potential of one polarity are axially spaced and/or radially spaced from the parts that are simultaneously at the highest electrical potential of the opposite polarity, with respect to a cylinder on which the drive coils are positioned.

8. A coil arrangement according to claim 7, wherein:
    there are at least two groups of drive coils, each group including at least two respective drive coils that are connected together in series, and
    the drive coils are arranged such that:
    a first group of the coils are arranged to make-up an innermost layer of the drive coils, high potential coils thereof being adjacent one end of the cylinder and low potential coils thereof being adjacent the other end of the cylinder; and
    (b) a second group of coils arranged to make-up a layer radially outside and juxtaposed with the radially innermost layer, high potential coils thereof being adjacent the other end of the cylinder and low potential coils thereof being adjacent the one end of the cylinder.

9. A coil arrangement according to claim 8, wherein a third group of the drive coils are arranged to make-up a radially outermost layer juxtaposed with the second group, high potential coils of the third group being adjacent the one end of the cylinder and low potential coils of the third group being adjacent the other end of the cylinder.

10. A coil arrangement according to claim 7, wherein:
    there are three groups of drive coils, each group including at least two respective drive coils that are connected together in series, and
    the drive coils are arranged such that highest potential coils of a first group of the coils and highest potential coils of a second group of the coils make up a radially innermost layer on the surface of the cylinder; and arranged such that lowest potential coils of the first and the second groups of drive coils make up a second layer, radially outside and juxtaposed with the innermost layer,
    thereby allowing coils of a third group of drive coils to be laid radially outside the second layer, such that high potential lengths of the coils of the third group are radially spaced from the high potential coils of the first and second groups that make up the radially innermost layer by the radially intermediate second layer of low potential coils.

11. A coil arrangement according to claim 8, wherein the first and second group of drive coils correspond to X and Y drive coils, and the third group of drive coils correspond to Z drive coils.

12. A coil arrangement according to claim 8, wherein each group includes shield coils connected between the drive coils thereof.

13. A coil arrangement according to claim 8, wherein electrically adjacent and spirally wound coils of the same group are connected together at the outermost end of each coil.

14. A coil arrangement according to claim 1, wherein: the drive coils are positioned on or around one or more planar surfaces, rather than the curved surface of a cylinder, foregoing references to a radius of the cylinder being interpreted as references to directions normal to the planar surfaces, and references to an axis of the cylinder being interpreted as references to lengths of the planar surfaces.

15. A coil arrangement according to claim 1, wherein, at least some of the drive coils are substantially spirally wound and those drive coils thereof that are for connecting electrically adjacent to a power supply or to shield coils during use are arranged for connection to the supply at a center-most end thereof, that is the "eye" of the respective spirally wound coil.

16. A drive coil arrangement for use in Magnetic Resonance Imaging and Spectroscopy apparatus, the drive coil arrangement including at least one group of drive coils including:

at least two respective drive coils connected together in series, wherein the coils are spatially arranged such that, in use, the potential differences between adjacent parts thereof are minimized, thereby minimizing partial discharge therebetween.

* * * * *